United States Patent [19]

Ferris, deceased et al.

[11] 4,395,375

[45] Jul. 26, 1983

[54] METHOD OF ELECTRICALLY TESTING MOLDED CORD-SETS DURING THE MOLDING OPERATION

[75] Inventors: William E. Ferris, deceased, late of Stamford, Conn.; Gail Hennessy, executrix, New Fairfield, Conn.; John Doumas, Wilton; Harry McCarter, Old Greenwich, both of Conn.

[73] Assignee: Electrolux Corporation, Old Greenwich, Conn.

[21] Appl. No.: 514,391

[22] Filed: Oct. 15, 1974

[51] Int. Cl.$^3$ ............................................... B29C 6/04
[52] U.S. Cl. .................................... 264/40.1; 29/593; 29/856; 264/261; 264/272.15; 264/275; 264/277; 425/151; 425/169
[58] Field of Search .................. 264/272, 275, 277, 40, 264/46.7, 40.1, 40.2, 261; 29/593, 628; 425/135, 136, 151, 169

[56] References Cited

U.S. PATENT DOCUMENTS

| | | | |
|---|---|---|---|
| 2,304,667 | 12/1942 | Taylor | 264/40 |
| 2,586,609 | 2/1952 | Burke, Jr. | 264/272 |
| 2,729,850 | 1/1956 | Dewees | 264/272 |
| 3,170,966 | 2/1965 | Kemeny et al. | 264/40 |
| 3,259,968 | 7/1966 | Dyksterhouse | 264/72 |
| 3,319,288 | 5/1967 | Johnson | 425/174.6 |
| 3,328,504 | 6/1967 | Hamel | 264/272 |
| 3,562,902 | 2/1971 | Green | 29/593 |
| 3,617,876 | 11/1971 | Robinson | 425/169 |
| 3,668,779 | 6/1972 | Turner | 264/272 |
| 3,728,057 | 4/1973 | Grundmann et al. | 425/151 |

*Primary Examiner*—James B. Lowe

[57] ABSTRACT

In accordance with the present invention, there is provided an improved arrangement for and method of electrically testing a cord-set during the molding of the male plug and female receptacle to the opposite ends of the insulated electric cord. In order to accomplish this, the mold for forming the molded plug and receptacle is provided with suitable contacts which upon the closing of the mold automatically establish electrical connections between the terminals of the cord-set and circuits in testing apparatus. These tests consist of checking for continuity in each conductor and for shorts between conductors or terminals and a skin ground test for the purpose of detecting stray strands of wire or any current carrying object that would carry current to the outside surface of the molded plug or receptacle. For the latter test, the metal of the mold itself, which closely embraces the entire outer surfaces of the plug and receptacle, serves as the ground as it is in contact with any conducting particle which extends to the outer surface.

4 Claims, 5 Drawing Figures

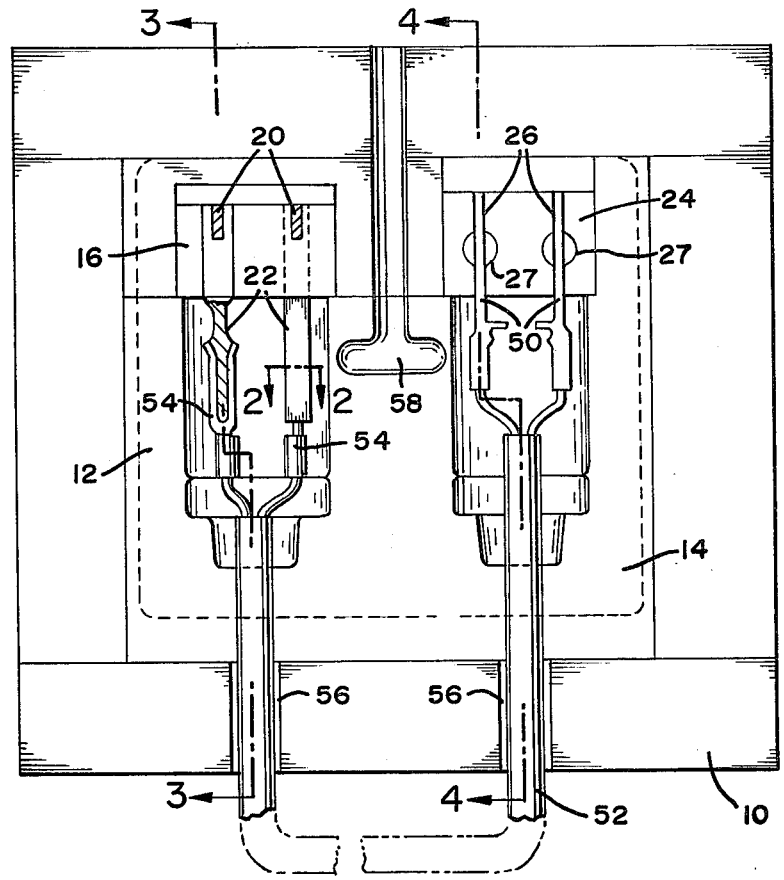
FIG. 1
FIG. 2
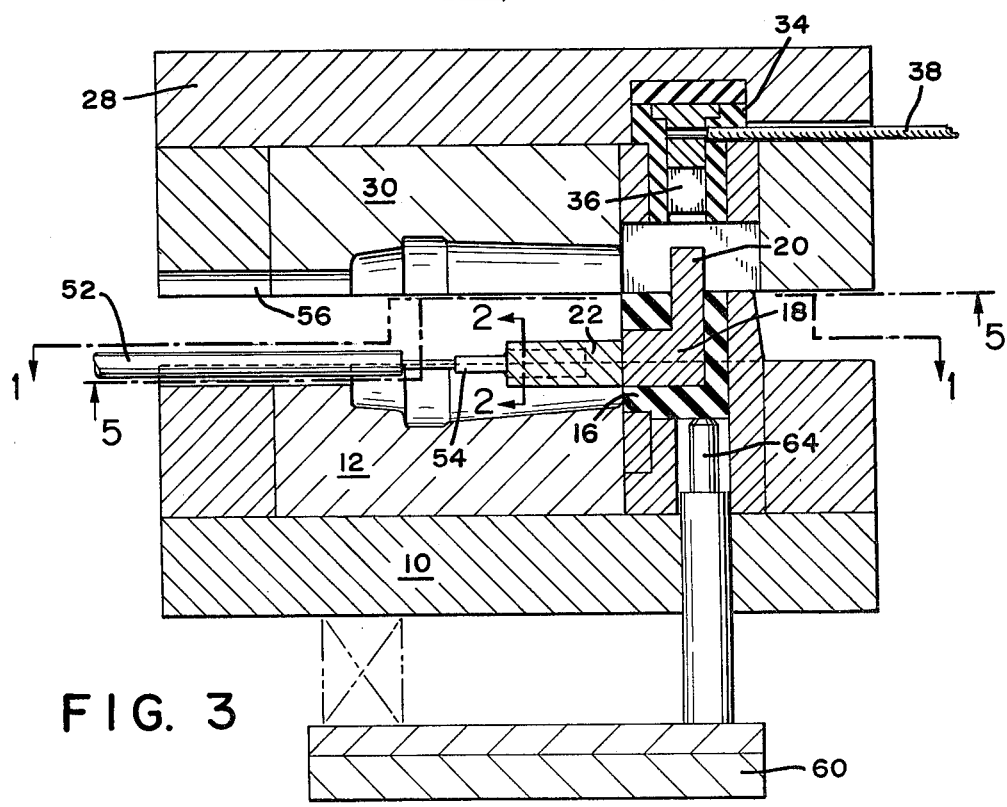
FIG. 3

METHOD OF ELECTRICALLY TESTING MOLDED CORD-SETS DURING THE MOLDING OPERATION

BACKGROUND OF THE INVENTION

Heretofore, in order to test electric cord-sets, it has been necessary after the cord-set has been completed and removed from the molding machine, to place the male plug and female receptacle in special fixtures which closely embrace the outer surfaces thereof and which establish electrical connections with the contacts of the plug and receptacle. This, of course, required additional time and labor, which is eliminated by conducting the tests during the molding operation. Also, the electrical test may be carried out before the molding compound is injected and, if the test is negative, the parts may be removed and repaired, which could not be done after molding.

SUMMARY OF THE INVENTION

A molded cord-set is tested for opens, shorts and grounds during the molding operation, the molding machine being provided with contacts for automatically establishing electrical circuits with the contacts of the plug and receptacle of the set, while the metal of the mold itself serves as a ground.

DESCRIPTION OF THE FIGURES

FIG. 1 is a view, partially in cross-section, looking down into the lower mold half while the mold is open and is taken on the lines 1—1 of FIGS. 3 and 4.

FIG. 2 is a cross-sectional view on an enlarged scale taken on the line 2—2 of FIGS. 1 and 3;

FIG. 3 is a cross-sectional view taken on the line 3—3 of FIG. 1;

Referring to the drawings, reference character 10 designates the lower mold base within which is mounted a female receptacle lower cavity 12 and a male plug lower cavity 14. To the right of cavity 12, as viewed in FIG. 3, is a block of electrical insulating material 16 within which is molded a pair of electrical conductors 18 having vertically extending contact blades 20 and combined contacts and locator blades 22 which extend horizontally into the female receptacle cavity. As shown in FIG. 2, each blade 22 is I-shaped in cross-section.

As illustrated in FIGS. 1 and 4, a block of insulating material 24 is located to the right of male plug cavity 14 and, as is shown in FIG. 1, is formed with a pair of slots 26 having enlarged circular recesses 27.

In FIG. 5, reference character 28 designates the upper mold base or frame within which are mounted a female receptacle upper cavity 30 and a male plug upper cavity 32. To the right of cavity 30, as seen in FIG. 3, is a block of insulating material 34 within which are mounted female contacts 36 which are in alignment with blades 20 and which are connected by conductors 38 with suitable test circuits.

In FIG. 4, a block of insulating material 40 is shown located to the right of upper cavity 32 and mounted therein are spring biased contact pins 42 urged downwardly by springs 44. These pins are aligned with recesses 27 formed in insulating material 24 in the lower mold, and are connected by means of conductors 46 with suitable circuits in the test apparatus. The metal mold is connected to the test apparatus by a ground conductor 48.

Figure 4:
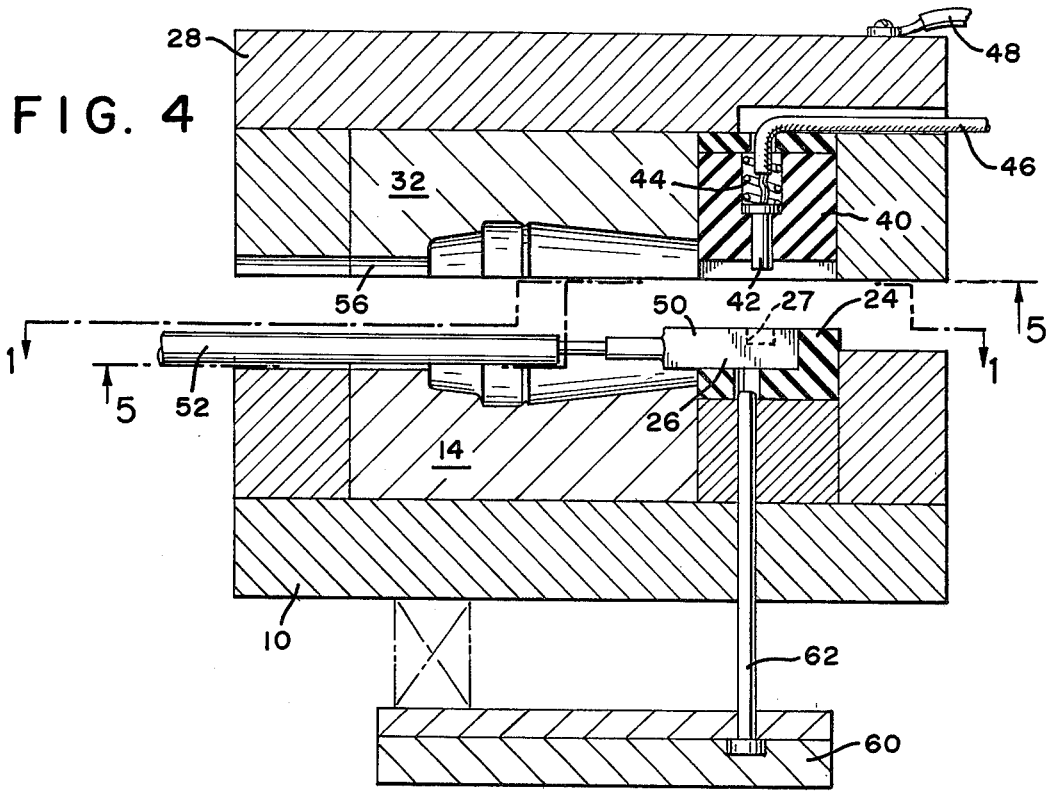
FIG. 4 is a cross-sectional view taken on the line 4—4 of FIG. 1.
Figure 5:
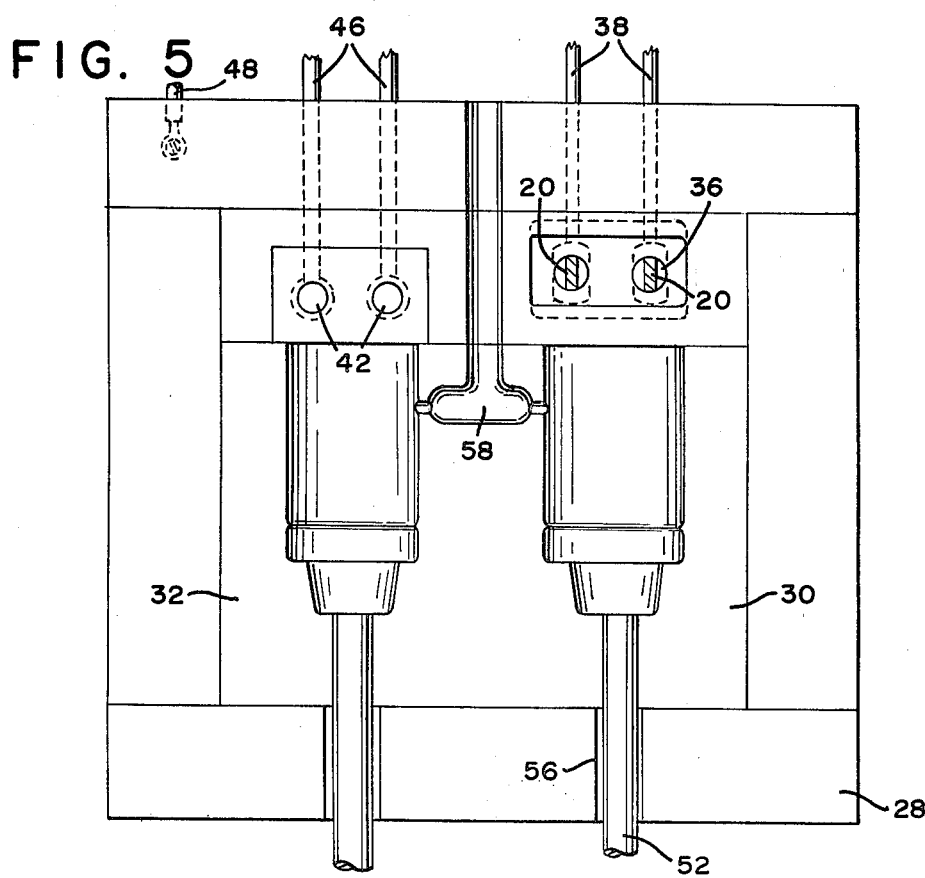
FIG. 5 is a view, partially in cross-section, looking up into the upper mold half while the mold is open and is taken on the lines 5—5 of FIGS. 3 and 4.

In order to manufacture a cord-set, male contact blades 50 are secured to the conductors at one end of a desired length of two-conductor insulated cord 52, while female terminals 54 are secured to the conductors at the other end of the cord. With the mold open, as shown in FIGS. 3 and 4, the blades 50 are placed in the slots 26 where they are retained by friction, thus properly locating the blades and connected conductors in the male plug cavity.

With the mold still open, the female terminals 54 are pushed onto the I-shaped blades 22, where they are retained by friction, the flanges of the blades assuring that the terminals 54 are in proper horizontal positions within the female receptacle cavity. This also establishes electric connections between the terminals 54 and the conductors 18 in the block 16.

The mold is then closed by suitable mechanism in the usual manner, as by raising the lower base 10, suitable grooves 56 being provided to permit the cord 52 to extend out of the mold cavities.

Molding compound is then injected through the usual gate 58 into both cavities and completely fills these cavities around the contacts 50 and 54 and the ends of the cord 52 which, when it sets up, forms a female receptacle molded to one end of the cord with the female terminals 54 recessed therein and a male plug molded to the other end of the cord with the male contacts 50 protruding from the plug.

When the mold is closed, the blades 20 on conductors 18 engage the contacts 36 and consequently the female contacts are electrically connected to conductors 38 leading to the test circuits. At the same time, the spring biased pins 42 enter the circular recesses 27 in the insulated material 24 and contact the blades 50 in the slots 26, thus connecting the blades to the conductors 46 of the test circuits.

Before the molding compound has been injected into the cavities, the cord-set may be tested electrically by establishing suitable connections through the conductors 38 and 46 to determine if there is continuity through the terminals and conductors of the cord-set, and to determine if there is a short circuit between the conductors and terminals. Also, the assembledge may be tested for incipiant grounds, which could be caused by stray strands of wire which might extend to the outer surface of the receptacle or plug about to be molded, by applying high voltage through conductors 38 and 46 and employing the metal molds as a ground connected to the test apparatus through conductor 48. Should any of these tests be negative, the compound is not injected, but the mold is opened and the cord and terminals removed to be repaired or discarded.

If the above tests are all positive, the molding compound is injected and thereafter the tests are preferably repeated to be certain that the finished cord-set is not defective.

After the molding compound has set up and the above tests have been completed, the mold is opened in the usual manner and a standard ejector plate 60 raised. This causes ejector pins 62 to push blades 50 out of slots 26, and ejector pin 64 to lift insulating material 16 and locator blades 22 sufficiently so that the female contacts 54 and the receptacle molded around them may be withdrawn from the blades 22.

When the mold is open, it will be noted that the female contacts 54 and the male blades 50 are automatically disconnected from the test circuits, thus eliminating any possibility of the operator receiving an electric shock while removing the receptacle and plug from the mold, the disengagement of the blades 20 from the contacts 36 and the pins 42 from the male blades 50 serving as circuit interrupters.

While we have shown and described one more or less specific embodiment of our invention, it is to be understood that this has been done for purposes of illustration only, and is not to constitute a limitation of the scope thereof, which is to be determined by the appended claims.

We claim:

1. The method of molding and electrically testing a cord-set while the female contacts and male contacts of said set are in a metallic mold having first and second portions comprising the steps of securing female contacts to one end of an insulated cord and securing male contacts to the other end thereof, positioning said female contacts in a first cavity of said first mold portion for molding a female receptacle, positioning said male contacts in a second cavity of said first mold portion for molding a male plug, removably securing said female and male contacts to electrically conductive locating means mounted in fixed positions on said first portion of said mold and electrically insulated therefrom, connecting a plurality of electrical test circuits to connectors carried by said second mold portion in positions to engage said locating means when said first and second mold portions are closed, moving said first and second mold portions into engagement with each other thereby simultaneously electrically connecting said test circuit connectors to said locating means while closing said first and second cavities, introducing thermoplastic molding compound into said first and second cavities to mold a receptacle and a plug on opposite ends of said cord and around at least portions of said contacts, electrically testing said cord-sets by applying test voltages through said test circuits while said first and second mold portions are closed, separating said first and second mold portions and automatically disconnecting said test circuit connectors from said locating means as a result of such separation, and removing said receptacle and said plug from said first mold portion while removing said female and male contacts from said locating means.

2. The method as set forth in claim 1 including the step of connecting a ground conductor to one of said mold portions, applying a high voltage to said cord-set, and utilizing said first and second portions of said mold as a ground.

3. The method as set forth in claim 1 in which said test voltages are applied prior to the introduction of said molding compound into said cavities.

4. The method as set forth in claim 2 in which said high voltage is applied prior to the introduction of said molding compound into said cavities.

* * * * *